(12) United States Patent
Lee et al.

(10) Patent No.: US 9,780,772 B2
(45) Date of Patent: Oct. 3, 2017

(54) POWER SUPPLY DEVICE

(71) Applicant: GREEN SOLUTION TECHNOLOGY CO., LTD., New Taipei (TW)

(72) Inventors: Li-Min Lee, New Taipei (TW); Zhong-Wei Liu, Wuxi (CN); Shian-Sung Shiu, New Taipei (TW); Ying-Ying Yang, Wuxi (CN)

(73) Assignee: GREEN SOLUTION TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/948,397

(22) Filed: Nov. 23, 2015

(65) Prior Publication Data

US 2016/0191049 A1   Jun. 30, 2016

(30) Foreign Application Priority Data

Dec. 29, 2014 (CN) .......................... 2014 1 0834920

(51) Int. Cl.
*H03K 3/00* (2006.01)
*H03K 17/082* (2006.01)
*G06F 1/26* (2006.01)

(52) U.S. Cl.
CPC ........... *H03K 17/0822* (2013.01); *G06F 1/26* (2013.01); *H03K 2217/0081* (2013.01)

(58) Field of Classification Search
CPC ........ H03K 17/0822; H03K 2217/0081; G06F 1/26
See application file for complete search history.

(56) References Cited

U.S. PATENT DOCUMENTS 6,229,355 B1 * 5/2001 Ogasawara ........ H03K 17/0822
326/85
6,753,204 B1 * 6/2004 Mayer ..................... H01L 23/60
438/107

(Continued)

FOREIGN PATENT DOCUMENTS

JP   2012112931   6/2012
TW   439367   6/2001

(Continued)

OTHER PUBLICATIONS

"Office Action of Taiwan Counterpart Application", issued on Dec. 1, 2015, p. 1-p. 6.

*Primary Examiner* — Kenneth B Wells
(74) *Attorney, Agent, or Firm* — Jianq Chyun IP Office

(57) ABSTRACT

A power supply device is provided. The power supply device includes a power transistor, a detection circuit and a driving circuit. The power transistor is controlled by the driving circuit to generate an output current. A first end of the power transistor is coupled to a power voltage pin through a first bonding wire. A second end of the power transistor is configured to output the output current. The detection circuit is coupled between two ends of the first bonding wire to detect the output current and generate a control signal. The driving circuit generates a driving signal according to the control signal. When the output current value is larger than or equal to an over-current-protection current value, the driving circuit starts to adjust a voltage value of the driving signal, such that the output current value is kept at the over-current-protection current value.

10 Claims, 9 Drawing Sheets

(56) References Cited

U.S. PATENT DOCUMENTS

| | | | | |
|---|---|---|---|---|
| 7,321,257 | B2 * | 1/2008 | Yamamoto | G05F 1/56 323/316 |
| 7,573,287 | B2 * | 8/2009 | Rabenstein | H03K 17/0822 326/113 |
| 9,147,675 | B2 * | 9/2015 | Yeh | H01L 24/48 |

FOREIGN PATENT DOCUMENTS

| | | |
|---|---|---|
| TW | 201110518 | 3/2011 |
| TW | 201218601 | 5/2012 |
| TW | 201338113 | 9/2013 |

* cited by examiner

Replacement Sheet

POWER SUPPLY DEVICE

CROSS-REFERENCE TO RELATED APPLICATION

This application claims the priority benefit of Chinese application serial no. 201410834920.3, filed on Dec. 29, 2014. The entirety of the above-mentioned patent application is hereby incorporated by reference herein and made a part of this specification.

BACKGROUND OF THE INVENTION

1. Field of the Invention

The invention relates to an electronic device, and particularly relates to a power supply device.

2. Description of Related Art

The power supply device has been broadly applied to the electronic technology field. Under the consideration of System on Chip (SoC), the power supply device is often as an electronic device embedded in a chip.

FIG. 1 is a schematic circuit diagram illustrating a conventional power supply device, which may serve as a power protection device for a USB port or serve as a power supply device of the USB port to charge a mobile device. FIG. 2 is a diagram illustrating a relation between an output voltage $V_O$ and an output current $I_O$ of the power supply device 100 shown in FIG. 1. Referring to FIGS. 1 and 2 together, the power supply device 100 includes a control circuit 102, transistors M1 and M2, and a resistor R2. Therein, the transistor M1 is coupled between a power voltage VDD and an output end OUT of the power supply device 100. The resistor R2 is coupled between the power voltage VDD and a node P. The transistor M2 is coupled between the node P and the output end OUT of the power supply device 100. Gate ends of the transistors M1 and M2 are coupled to the control circuit 102. An input end of the control circuit 102 is coupled to the node P, and another input end of the control circuit 102 receives a reference voltage $V_{REF}$. The reference voltage $V_{REF}$ is related to an over-current-protection current value $I_{OCP}$.

The transistor M1 provides a current $I_{M1}$, and the transistor M2 provides a current $I_{M2}$. An output current $I_O$ is a total of the current $I_{M1}$ and the current $I_{M2}$. Therein, the transistor M2 is a sampling transistor of the transistor M1. The resistor R2 is a sampling resistor. Since a size ratio between the transistor M1 and the transistor M2 is a fixed value, the transistor M2 may be used to sample the current $I_{M1}$, and the control circuit 102 is further used to detect whether the output current $I_O$ exceeds the over-current-protection current value $I_{OCP}$.

Specifically, the gate ends of the transistors M1 and M2 receive the same voltage signal, and source ends of the transistors M1 and M2 are coupled to each other. Thus, the currents $I_{M1}$ and $I_{M2}$ are related to the size ratio of the transistors M1 and M2 and drain-source voltage differences of the transistors M1 and M2. Therein, a voltage at the drain end of the transistor M1 is the power voltage VDD, and a voltage at the drain end of the transistor M2 is a sampling voltage $V_P$ at the node P. When the current $I_{M2}$ flows through the resistor R2, the sampling voltage $V_P$ is generated at the node P. Thus, by detecting the sampling voltage $V_P$, the current $I_{M2}$ can be obtained. Then, based on the size ratio between the transistors M1 and M2 and drain-source voltage differences $V_{DS1}$ and $V_{DS2}$ thereof, the current $I_{M1}$ can be obtained. Consequently, the output current $I_O$ is detected and known. In other words, variation of the output current $I_O$ can be indirectly detected through the sampling voltage $V_P$. Since the sampling voltage $V_P$ is related to the output current $I_O$, and the reference voltage $V_{REF}$ is related to the over-current-protection current value $I_{OCP}$, the control circuit 102 may detect whether the current value of the output current $I_O$ is greater than the over-current-protection current value $I_{OCP}$ based on the sampling voltage $V_P$ and the reference voltage $V_{REF}$.

When the current value of the output current $I_O$ is smaller than the over-current-protection current value $I_{OCP}$, as shown in a region between points A and B in FIG. 2, the transistors M1 and M2 are operated in a linear region. At this time, the currents $I_{M1}$ and $I_{M2}$ are respectively related to the drain-source voltage difference $V_{DS1}$ of the transistor M1 and the drain-source voltage difference $V_{DS2}$ of the transistor M2. In addition, $V_{DS1}$ is greater than $V_{DS2}$.

Once the current value of the output current $I_O$ is equal to the over-current-protection current value $I_{OCP}$, as shown at the point B in FIG. 2, the sampling voltage $V_P$ is equal to the reference voltage $V_{REF}$. Once the current value of the output current $I_O$ is greater than the over-current-protection current value $I_{OCP}$, the power supply device 100 enters the over-current-protection state. The control circuit 102 controls gate voltages of the transistors M1 and M2 according to the sampling voltage $V_P$ and the reference voltage $V_{REF}$, and keeps the sampling voltage $V_P$ at the reference voltage $V_{REF}$. At this time, based on loads, an operation region of the transistors M1 and M2 may be between points B and C or between points C and D. If a load impedance is smaller, the operation region of the transistors M1 and M2 may be transited from the linear region (between points B and C shown in FIG. 2) to a saturation region (i.e., a region between points C and D in FIG. 2), and a relatedness of the currents $I_{M1}$ and $I_{M2}$ and $V_{DS1}$ and $V_{DS2}$ is low. Since a current ratio when the transistors M1 and M2 are operated in the linear region is greater than a current ratio when the transistors M1 and M2 are operated in the saturation region, and a current when the transistor M2 is operated in the saturation region (the region between points C and D in FIG. 2) is substantially equivalent to a current when the transistor M2 is at an over-current point (point B shown in FIG. 2) (since the sampling voltage $V_P$ is kept at the reference voltage $V_{REF}$ in the regions between points B (including point B) and C and between points C and D in FIG. 2, the current flowing through the resistor R2 and the transistor M2 keeps the same), the current value of the output current $I_O$ (also called a short circuit current value $I_{SC}$) of the power supply device 100 after entering the over-current-protection state is smaller than the over-current-protection value $I_{OCP}$, as shown in FIG. 2.

Since the current value of the output current $I_O$ (i.e., the short circuit current value $I_{SC}$) of the power supply device 100 after entering the over-current-protection state is lower than the over-current-protection value $I_{OCP}$, the output voltage may be unable to be elevated to an effective level (e.g., a voltage level of 5V for a USB device). In addition, a charging current value provided to the mobile device may be lower, making charging slower. Although the short circuit current value $I_{SC}$ may be increased by increasing the over-current-protection current value $I_{OCP}$, the accuracy of the short circuit current value $I_{SC}$ cannot be improved. This is because the current value of the output current $I_O$ is the total of current values of the currents $I_{M1}$ and $I_{M2}$, and there may be an inaccuracy in the size ratio between the transistors M1 and M2 and an inaccuracy in a resistance of the resistor R2, making the sampling voltage $V_P$ unable to correctly reflect the real current $I_{M1}$ (or the real output current $I_O$). Thus, the control circuit 102 is unable to accurately control the gate voltages of the transistors M1 and M2, and the accuracy of the short circuit value $I_{SC}$ is thus unable to be improved effectively.

SUMMARY OF THE INVENTION

Accordingly, the invention provides a power supply device capable of making a current value of an output current thereof after entering an over-current-protection state substantially equivalent to an over-current-protection current value and improving an accuracy of the output current.

A power supply device of the invention includes a first bonding wire, a second bonding wire, a power transistor, a detection circuit, and a driving circuit. The power transistor is configured to generate an output current. A first source/drain end of the power transistor is coupled to a sampling voltage pad. A second source/drain end of the power transistor is coupled to an output voltage pad. The sampling voltage pad is coupled to a power voltage pin through the first bonding wire. The output voltage pad is coupled to an output voltage pin through the second bonding wire. The detection circuit is configured to detect the output current flowing through the first bonding wire or the second bonding wire and generate a control signal accordingly. The driving circuit is configured to generate a driving signal in response to the control signal. The driving signal controls the power transistor to generate the output current. When a current value of the output current is greater than or equal to an over-current-protection current value, the driving circuit starts adjusting a voltage value of the driving signal in response to the control signal, such that the current value of the output current is kept at the over-current-protection current value.

Based on the above, the power supply device does not use another transistor to sample the output current. Therefore, the issue of different proportions of currents in a linear region and a saturation region does not exist. When the power supply device according to the invention enters the over-current-protection state, the current value of the output current that is generated by the power supply device is substantially equal to the over-current-protection current value. Thus, by setting a higher over-current-protection current value, the output current of the power supply device is effectively increased. In this way, the power supply device is allowed to have a higher starting load, thereby rapidly charging a mobile device. Besides, the detection circuit of the power supply device according to the invention detects the output current flowing through the bonding wire. Since the parasitic resistance on the bonding wire is able to be accurately controlled and has a smaller error, the detection circuit is thus allowed to accurately detect the output current by measuring the voltage on the bonding wire and control the current value of the output current at the over-current-protection current value when the power supply device enters the over-current-protection state. In this way, the accuracy of the current value of the output current may be increased when the power supply device enters the over-current-protection state.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Descriptions of the invention are given with reference to the exemplary embodiments illustrated with accompanied drawings. In addition, whenever possible, identical or similar reference numbers denote identical or similar elements in the figures and the embodiments.

Figure 1:
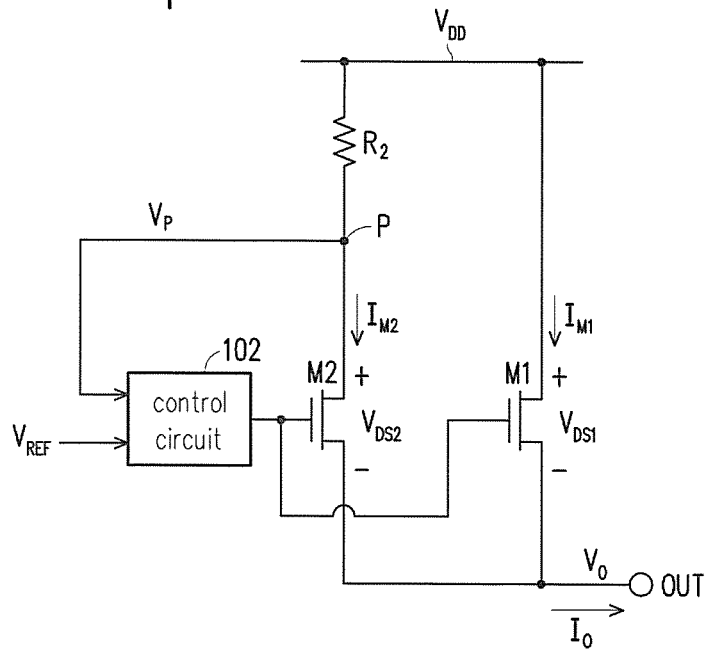
FIG. 1 is a schematic circuit diagram illustrating a conventional power supply device.
Figure 2:
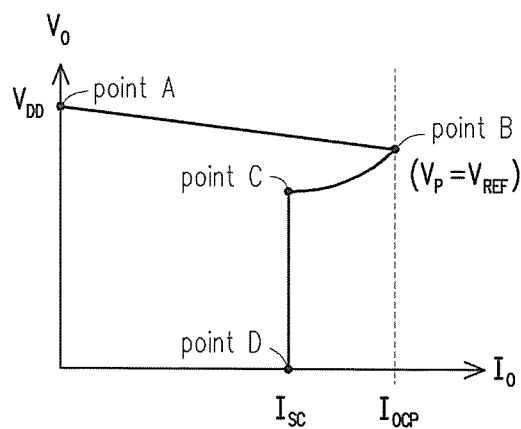
FIG. 2 is a diagram illustrating a relation between an output voltage and an output current of the power supply device shown in FIG. 1.
Figure 3:
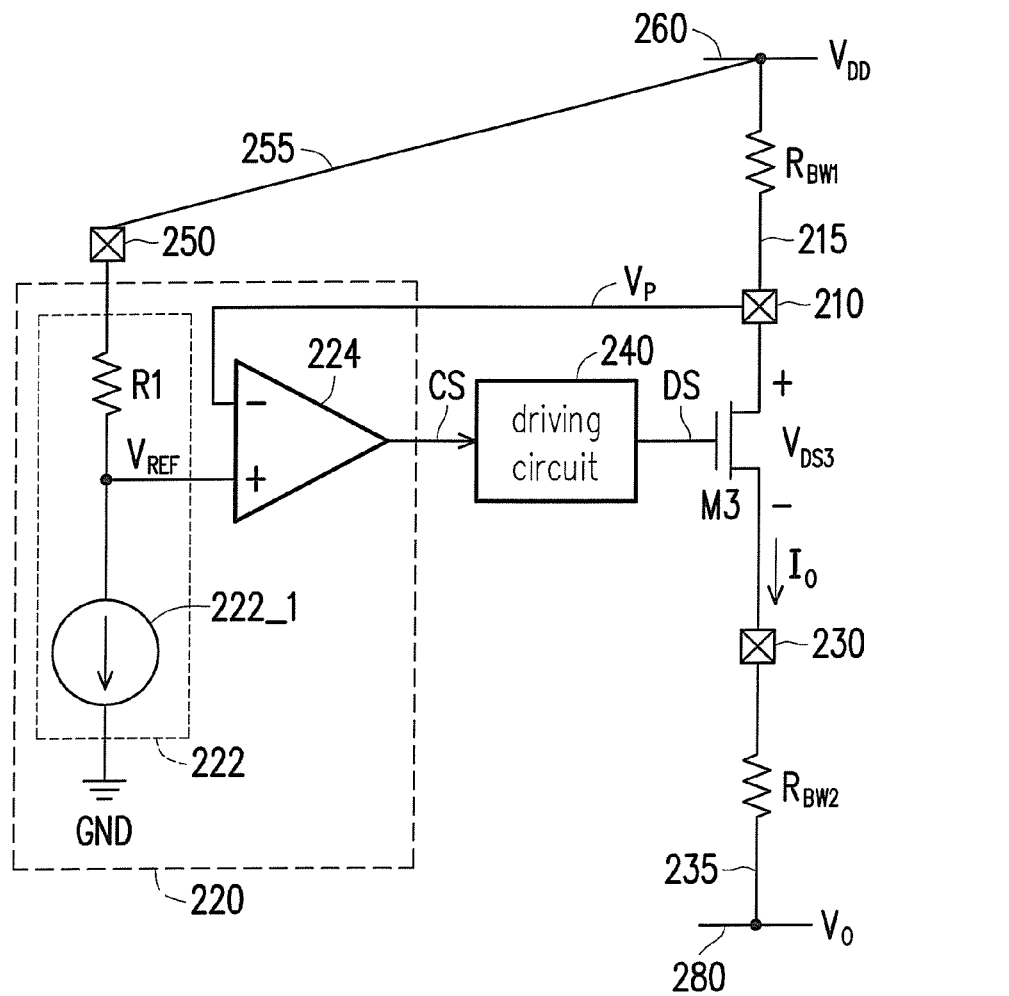
FIG. 3 is a schematic block diagram illustrating a power supply device according to an embodiment of the invention.
Figure 4:
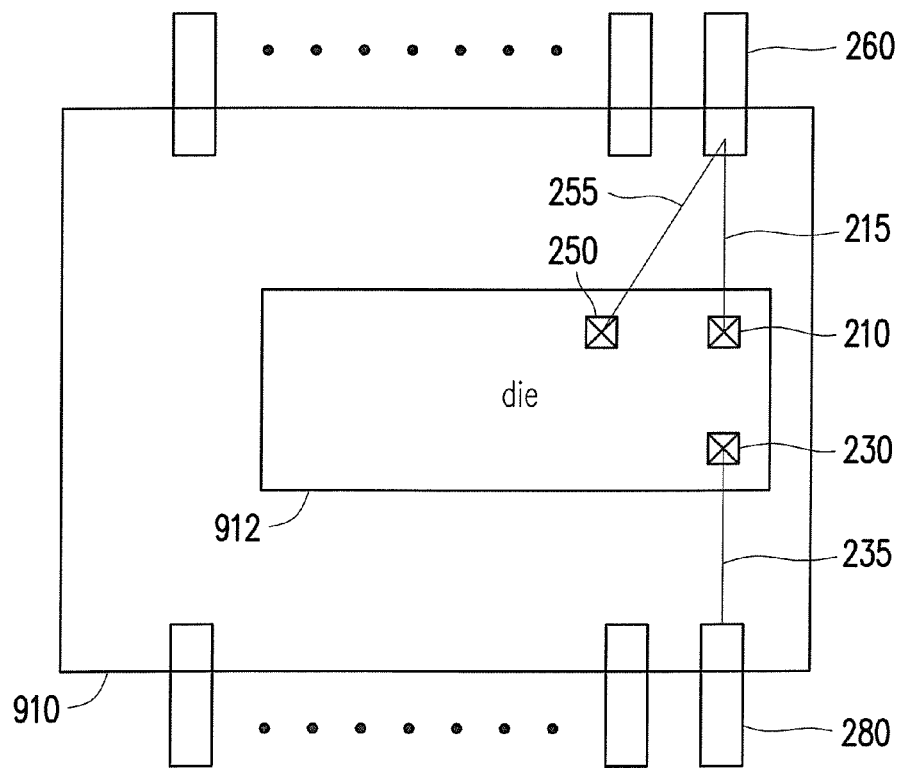
FIG. 4 is a schematic diagram illustrating a package structure of the power supply device shown in FIG. 3.

Referring to FIGS. 3 and 4 together, FIG. 3 is a schematic block diagram illustrating a power supply device 200 according to an embodiment of the invention, and FIG. 4 is a schematic diagram illustrating a package structure of the power supply device 200 shown in FIG. 3. The power supply device 200 may include a package structure 910. A die 912 in the package structure 910 includes a power transistor M3, a detection circuit 220 and a driving circuit 240. However, the invention is not limited thereto. In other embodiments of the invention, the power transistor M3, the detection circuit 220, and the driving circuit 240 may also be disposed in different dies. The power transistor M3 may be an N-type power transistor. However, the invention is not limited thereto. In another embodiment of the invention, the power transistor M3 may also be implemented as a P-type power transistor. The driving circuit 240 may be implemented as a charge pump.

The power transistor M3 is configured to generate an output voltage $V_O$ and an output current $I_O$. A first source/drain end of the power transistor M3 is coupled to a sampling voltage pad 210. A second source/drain end of the power transistor M3 is coupled to an output voltage pad 230. In addition, the sampling voltage pad 210 and the output voltage pad 230 are disposed on the die 912. The sampling voltage pad 210 is coupled to a power voltage pin 260 of the package structure 910 through a first bonding wire 215. The power voltage pin 260 receives a power voltage VDD. The output voltage pad 230 is coupled to an output voltage pin 280 of the package structure 910 through a second bonding wire 235. The output voltage pin 280 provides the output voltage $V_O$ and the output current $I_O$.

The detection circuit 220 may be coupled to two ends of the first bonding wire 215 to detect a current flowing through the first bonding wire 215, thereby generating a control signal CS. In this embodiment, since the output current $I_O$ is a current flowing through a serial circuit formed by the first bonding wire 215, the power transistor M3, and the second bonding wire 235, the current of the first bonding wire 215 detected by the detection circuit 220 is the output current $I_O$.

The driving circuit 240 is coupled to the detection circuit 220 to receive the control signal CS and generate a driving signal DS. In addition, a gate end of the power transistor M3 is coupled to the driving circuit 240 to receive the driving signal DS, such that the power transistor M3 is controlled by the driving signal DS to generate the output voltage $V_O$ and the output current $I_O$.

Figure 5:
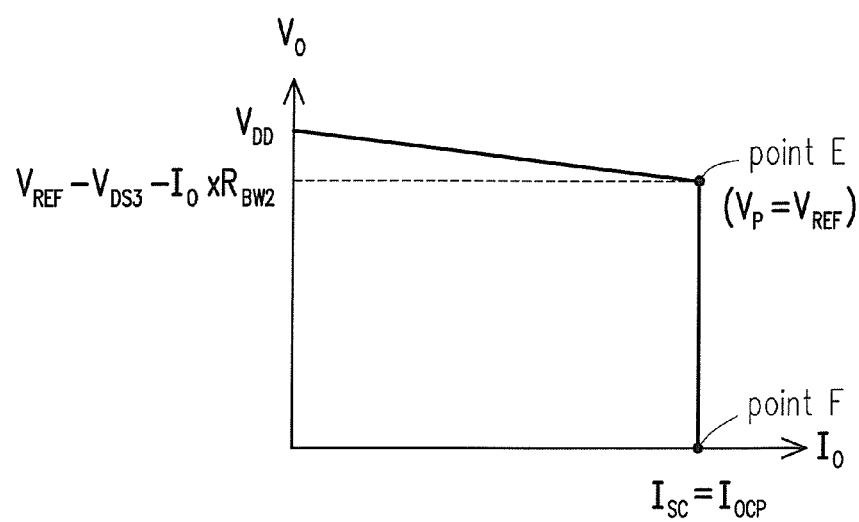
FIG. 5 is a diagram illustrating a relation between an output voltage and an output current of the power supply device shown in FIG. 3.

Referring to FIG. 5 for this embodiment, FIG. 5 is a diagram illustrating a relation between the output voltage $V_O$ and the output current $I_O$ of the power supply device 200 shown in FIG. 3. When a current value of the output current $I_O$ is smaller than an over-current-protection current value $I_{OCP}$, the driving circuit 240 may fix a voltage value of the driving signal DS in response to the control signal CS, so as to operate the power transistor M3 in a linear region. When the detection circuit 220 detects that the current value of the output current $I_O$ is greater than or equal to the over-current-protection current value $I_{OCP}$, the power supply device 200 enters an over-current-protection state. The driving circuit 240 may start adjusting the voltage value of the driving signal DS in response to the control signal CS, so as to reduce the gate voltage of the power transistor M3, such that the current value of the output current $I_O$ generated by the power transistor M3 is kept at the over-current-protection current value $I_{OCP}$. Thus, the current value (i.e., a short circuit current value $I_{SC}$) of the output current $I_O$ of the power supply device 200 after entering the over-current-protection state is equal to the over-current-protection current value $I_{OCP}$. At this time, the power transistor M3 is operated in the linear region or a saturation region. If a drain-source voltage difference $V_{DS3}$ of the power transistor M3 is smaller than a difference between a gate-source voltage difference $V_{GS3}$ and a threshold voltage $V_t$ of the power transistor M3 (i.e., $V_{DS3}<V_{GS3}-V_t$), the power transistor M3 is operated in the linear region. Alternatively, if the drain-source voltage difference $V_{DS3}$ of the power transistor M3 is greater than or equal to the difference between the gate-source voltage difference $V_{GS3}$ and the threshold voltage $V_t$ of the power transistor M3 (i.e., $V_{DS3} \geq V_{GS3}-V_t$), the power transistor M3 is operated in the saturation region.

In the following, an embodiment of the detection circuit 220 is described in detail. Referring to FIGS. 3 to 5 together, the first bonding wire 215 has a parasitic resistance. The parasitic resistance may serve as a sampling resistor $R_{BW1}$. The sampling resistor $R_{BW1}$ may generate a sampling voltage $V_P$ in response to the output current $I_O$. In other words, the sampling voltage $V_P$ directly reflects variation of the output current $I_O$. The detection circuit 220 includes a reference voltage generating circuit 222 and a comparator 224. The reference voltage generating circuit 222 is coupled between a power voltage pad 250 and a ground voltage GND to generate a reference voltage $V_{REF}$. In addition, the power voltage pad 250 is disposed on the die 912 and coupled to the power voltage pin 260 through a third bonding wire 255. A non-inverting input end of the comparator 224 is coupled to the reference voltage generating circuit 222 to receive the reference voltage $V_{REF}$. An inverting input end of the comparator 224 is coupled to the sampling voltage pad 210 to receive the sampling voltage $V_P$. The comparator 224 compares the reference voltage $V_{REF}$ and the sampling voltage $V_P$ to generate the control signal CS.

In an embodiment of the invention, the reference voltage generating circuit 222 may include a reference resistor R1 and a current source 222_1. A first end of the reference resistor R1 is coupled to the power voltage pad 250. A second end of the reference resistor R1 is coupled to the non-inverting input end of the comparator 224. The current source 222_1 is coupled between the second end of the reference resistor R1 and the ground voltage GND. In this way, a current generated by the current source 222_1 may generate the reference voltage $V_{REF}$ at the second end of the reference resistor R1. In addition, the reference voltage $V_{REF}$ may serve as a reference voltage level of the over-current-protection current value $I_{OCP}$. Thus, the over-current-protection current value $I_{OCP}$ may be modified by modifying the voltage level of the reference voltage $V_{REF}$. It should be noted here that since the reference resistor R1 is coupled to the power voltage pin 260 through the power voltage pad 250 and the third bonding wire 255, the voltage level of the reference voltage $V_{REF}$ is not influenced when the output current $I_O$ generated by the power transistor M3 increases. In this way, an accuracy of the over-current-protection current value $I_{OCP}$ is increased. However, the invention is not limited thereto. In other embodiments, the current source 222_1 in the reference voltage generating circuit 222 may be replaced with a resistor.

When the power transistor M3 starts generating the output current $I_O$, the output current $I_O$ may form a voltage drop at two ends of the first bonding wire 215 (i.e., two ends of the sampling resistor $R_{BW1}$) and generates the sampling voltage $V_P$ at the sampling voltage pad 210. When the current value of the output current $I_O$ is smaller than the over-current-protection current value, the voltage value of the sampling voltage $V_P$ is greater than the voltage value of the reference voltage $V_{REF}$. The control signal CS at this time is at a logic-low level, for example. The driving circuit 240 may fix the voltage value of the driving signal DS at a voltage level in response to the control signal CS, such that the power transistor M3 is operated in a linear region.

When the output voltage pin 280 is erroneously connected to the ground or an external load (not shown) coupled to the output voltage pin 280 rapidly increases, making the output current $I_O$ increase, the voltage drop at the two ends of the sampling resistor $R_{BW1}$ also increases, making the sampling voltage $V_P$ at the sampling voltage pad 210 decrease. When the current value of the output current $I_O$ is greater than or equal to the over-current-protection current value $I_{OCP}$, the voltage value of the sampling voltage $V_P$ is smaller than or equal to the voltage value of the reference voltage $V_{REF}$. The comparator 224 compares the sampling voltage $V_P$ and the reference voltage $V_{REF}$ to generate the control signal CS. The control signal CS at this time is at a logic-high level, for example. The driving circuit 240 starts adjusting the voltage value of the driving signal DS in response to the control signal CS by, for example, lowering the voltage level of the driving signal DS, such that the current value of the output current $I_O$ generated by the power transistor M3 is kept at the over-current-protection current value $I_{OCP}$ and the voltage value of the sampling voltage $V_P$ is kept at the voltage value of the reference voltage $V_{REF}$. Between points E to F, as shown in FIG. 5, the output voltage $V_O=V_{REF}-V_{DS3}-(I_O \times R_{BW2})$. In this equation, $V_{DS3}$ is the drain-source voltage difference of the power transistor M3, and $R_{BW2}$ is a parasitic resistance on the second bonding wire 235. In addition, the current value of the output current $I_O$ (i.e., the short circuit current value $I_{SC}$, equal to the over-current-protection current value $I_{OCP}$) is represented in Formula (1).

$$I_O=(VDD-V_{REF}) \div R_{BW1} \quad (1)$$

Figure 6:
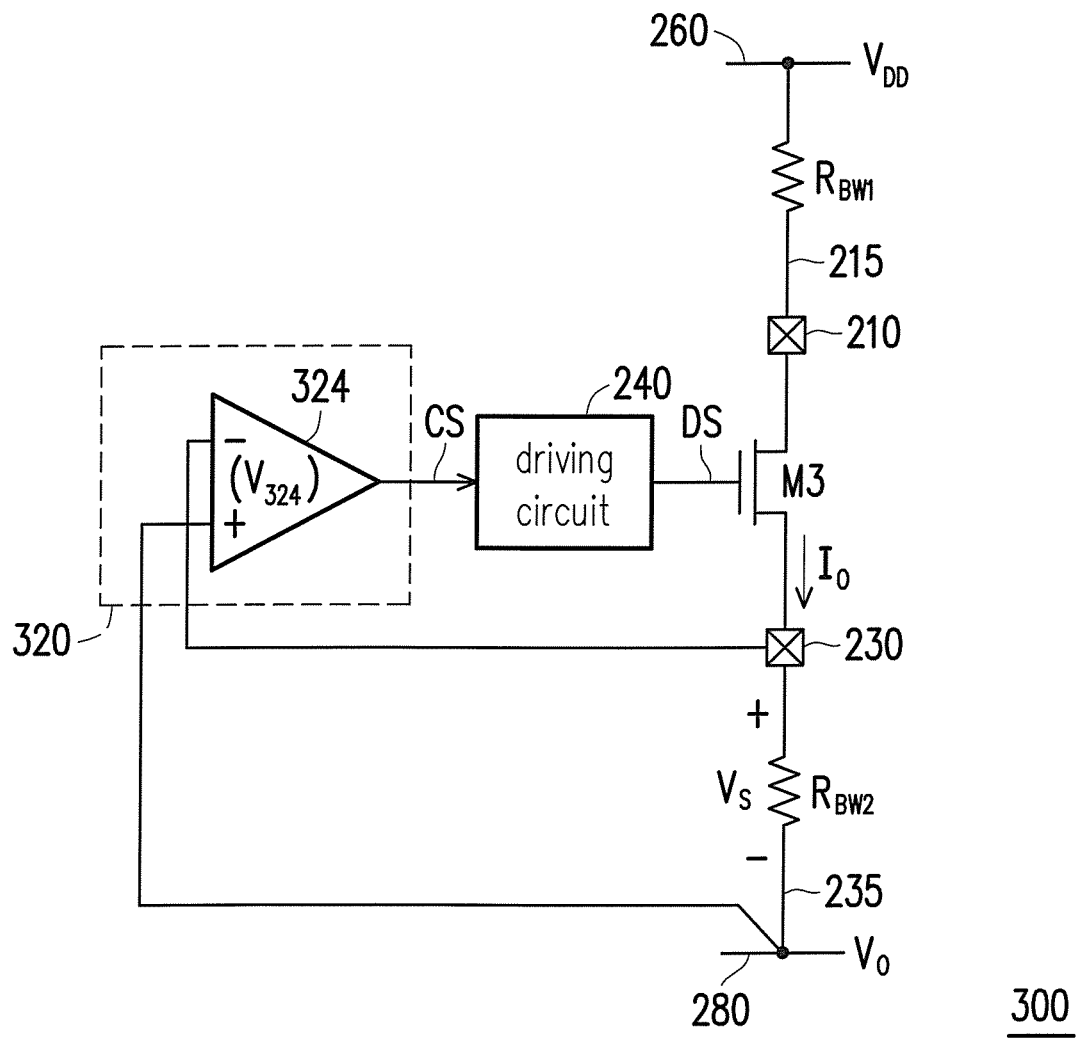
FIG. 6 is a schematic block diagram illustrating a power supply device according to another embodiment of the invention.

In another embodiment of the invention, in addition to the voltages at the two ends of the first bonding wire 215, voltages at two ends of the second bonding wire 235 may also faithfully reflect the output current $I_O$. Under this condition, referring to FIG. 6, FIG. 6 is a schematic block diagram illustrating a power supply device 300 according to another embodiment of the invention. The power supply device 300 includes the power transistor M3, a detection circuit 320, and the driving circuit 240. The power supply device 300 shown in FIG. 6 is similar to the power supply device 200 shown in FIG. 3, but differs in how the detection circuits 220 and 320 are embodied. Thus, details concerning embodiments of the power transistor M3 and the driving circuit 240 of the power supply device 300 shown in FIG. 6 may be referred to relevant description of FIGS. 3 to 5, and are thus not repeated in the following.

Compared with the power supply device 200 shown in FIG. 3, where the detection circuit 220 is coupled to the two ends of the first bonding wire 215 to detect the output current $I_O$, the detection circuit 320 of the power supply device 300 shown in FIG. 6 is coupled to the two ends of the second bonding wire 235 to detect the output current $I_O$. In the following, an embodiment of the detection circuit 320 is described in detail.

As shown in FIG. 6, when the output current $I_O$ flows through the parasitic resistance $R_{BW2}$ on the second bonding wire 235, a voltage difference $V_S$ is generated between two ends of the parasitic resistance $R_{BW2}$. Thus, the detection circuit 320 may control the output current $I_O$ according to the voltage difference $V_S$ between the two ends of the parasitic resistance $R_{BW2}$. In addition, the detection circuit 320 includes a comparator 324. The comparator 324 is coupled to the two ends of the second bonding wire 235 to detect the voltage difference $V_S$. The comparator 324 may compare the voltage difference $V_S$ with a built-in default reference voltage value $V_{324}$ to generate the control signal CS.

When the current value of the output current $I_O$ is smaller than the over-current-protection current value $I_{OCP}$, the voltage difference $V_S$ between the two ends of the parasitic resistance $R_{BW2}$ is smaller than the built-in default reference voltage value $V_{324}$. The comparator 324 compares the voltage difference $V_S$ with the default reference voltage value $V_{324}$ to generate the control signal CS. The control signal CS at this time is at a logic-low level, for example. The driving circuit 240 may fix the voltage value of the driving signal DS at a voltage level in response to the control signal CS, such that the power transistor M3 is operated in the linear region.

When the output voltage pin 280 is erroneously connected to the ground or an external load (not shown) coupled to the output voltage pin 280 rapidly increases, making the output current $I_O$ increase, the voltage difference $V_S$ between the two ends of the parasitic resistance $R_{BW2}$ also increases. When the current value of the output current $I_O$ is greater than or equal to the over-current-protection current value $I_{OCP}$, the voltage difference $V_S$ between the two ends of the parasitic resistance $R_{BW2}$ is greater than or equal to the default reference voltage value $V_{324}$. The comparator 324 compares the voltage difference $V_S$ with the default reference voltage value $V_{324}$ to generate the control signal CS. The control signal CS at this time is at a logic-high level, for example. The driving circuit 240 starts adjusting the voltage value of the driving signal DS in response to the control signal CS by, for example, lowering the voltage level of the driving signal DS, such that the current value of the output current $I_O$ generated by the power transistor M3 is kept at the over-current-protection current value $I_{OCP}$, thereby keeping the voltage difference $V_S$ at the default reference voltage value $V_{324}$.

Figure 7:
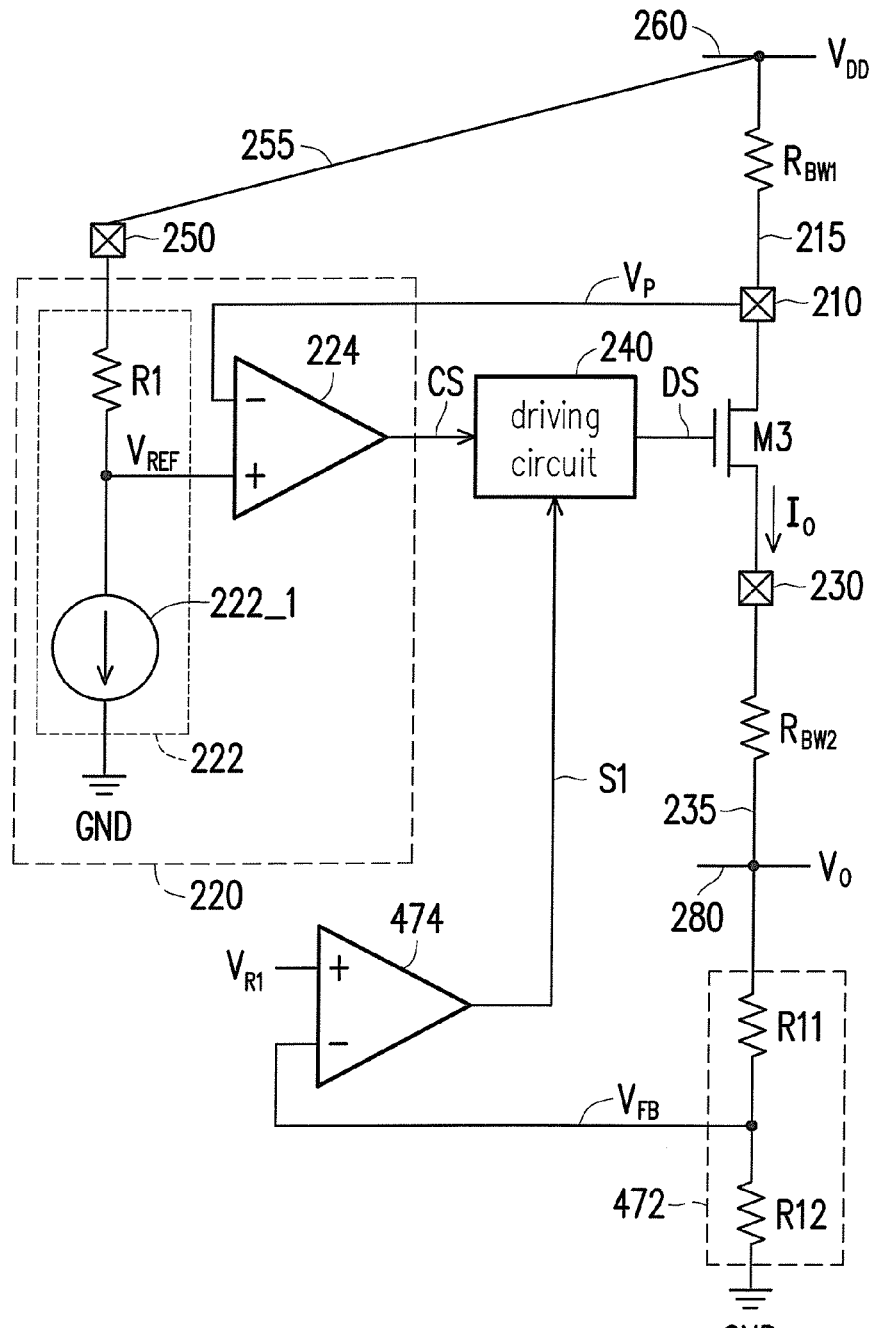
FIGS. 7-11 are schematic block diagrams illustrating power supply devices according to yet another embodiment of the invention.

In other embodiments of the invention, the power supply devices 200 and 300 shown in FIGS. 3 and 6 may also have a voltage stabilization function. Referring to FIG. 7, FIG. 7 is a schematic block diagram illustrating a power supply device 400 according to yet another embodiment of the invention. Compared with the power supply device 200 shown in FIG. 3, the power supply device 400 shown in FIG. 7 further includes a voltage dividing circuit 472 and a first comparator 474. In addition, the voltage dividing circuit 472 is coupled between the output voltage pin 280 and the ground voltage GND, so as to divide the output voltage $V_O$ to generate a feedback voltage $V_{FB}$. An inverting input end of the first comparator 474 is coupled to the voltage dividing circuit 472 to receive the feedback voltage $V_{FB}$. A non-inverting input end of the first comparator 474 receives a first reference voltage $V_{R1}$. The first comparator 474 compares the feedback voltage $V_{FB}$ and the first reference voltage $V_{R1}$ to generate a first comparison signal S1.

The voltage diving circuit 472 may include a first resistor R11 and a second resistor R12. The first resistor R11 is coupled between the output voltage pin 280 and the inverting input end of the first comparator 474. The second resistor R12 is coupled between the inverting input end of the first comparator 474 and the ground voltage GND. In addition, the voltage dividing circuit 472 may be disposed outside the package structure 910 shown in FIG. 4. However, the invention is not limited thereto. The voltage dividing circuit 472 may also be disposed on the die 912 of the package structure 910 shown in FIG. 4, or be disposed on another die (not shown) of the package structure 910.

The driving circuit 240 is further coupled to the first comparator 474 to receive the first comparison signal S1. The driving circuit 240 may generate the driving signal DS in response to the first comparison signal S1, so as to keep the voltage value of the output voltage $V_O$ generated by the power transistor M3 at a stable voltage value. For example, when a voltage value of the feedback voltage $V_{FB}$ is smaller than the first reference voltage $V_{R1}$, the first comparator 474 may generate the first comparison signal S1 at a high level. The driving circuit 240 may increase the voltage value of the driving signal DS in response to the first comparison signal S1 at a high level, and the power transistor M3 may enlarge the output current $I_O$ in response to an increase in a gate voltage value, so as to increase the voltage value of the output voltage $V_O$, and vice versa. In this way, the voltage value of the output voltage $V_O$ generated by the power transistor M3 is kept at a stable voltage value. In fact, the power supply device 400 shown in FIG. 7 may be substantially considered as a low drop-out voltage regulator (LDO).

Figure 8:
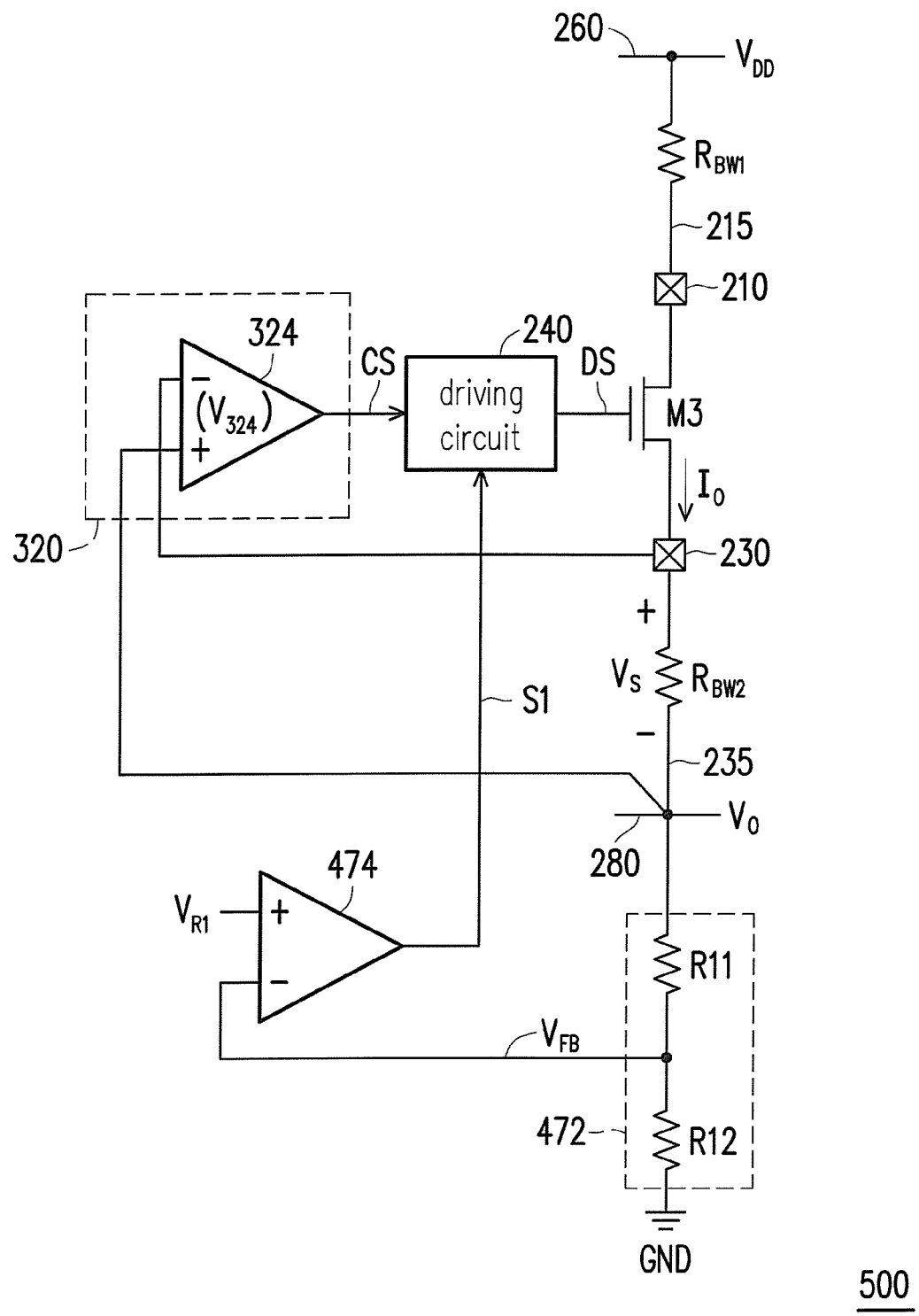

Besides, the voltage dividing circuit 472 and the first comparator 474 of the power supply device 400 shown in FIG. 7 may also be implemented in the power supply device 300 shown in FIG. 6 to realize the voltage stabilization function (as shown in FIG. 8). Such embodiment may be inferred based on relevant description about FIG. 7, and is thus not repeated hereinafter.

Figure 9:
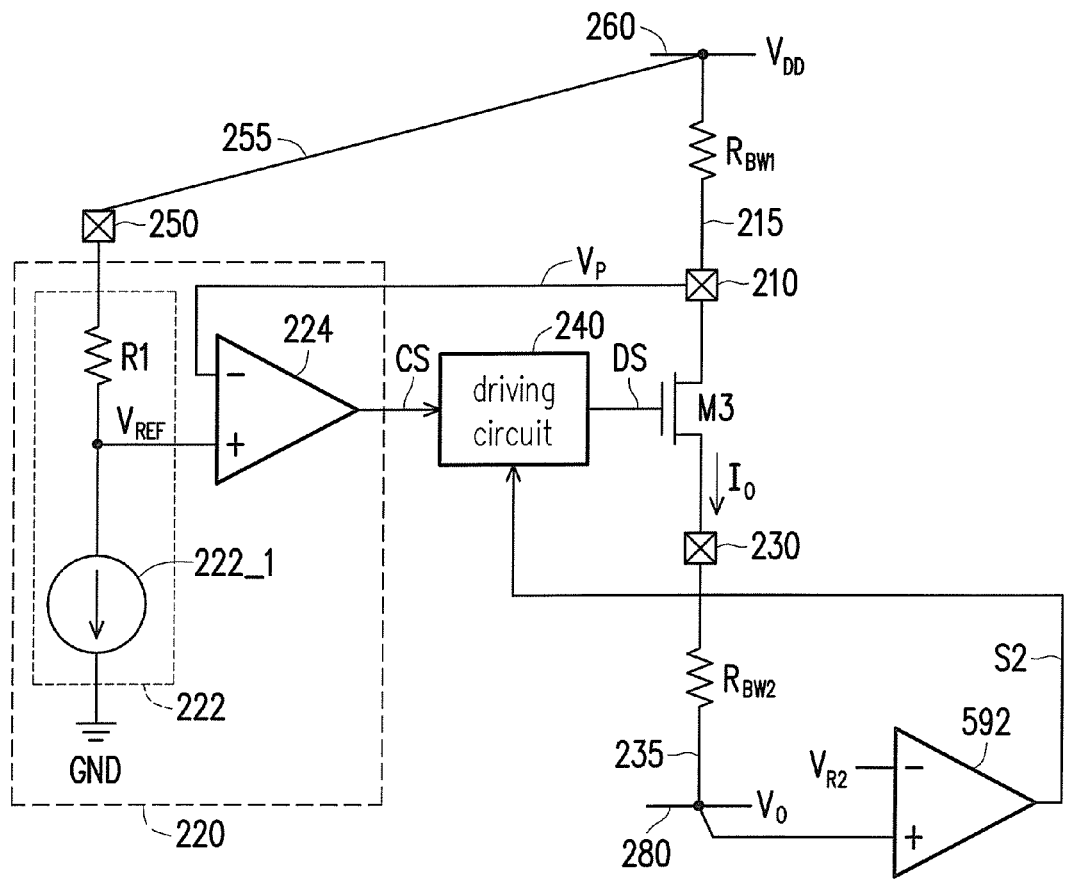

In the above embodiments, the power supply devices 200, 300, 400, and 500 shown in FIGS. 3, 6, 7, and 8 may also have a under-voltage protection function. Referring to FIG. 9, FIG. 9 is a schematic block diagram illustrating a power supply device 600 according to yet another embodiment of the invention. Compared with the voltage supply device 200 shown in FIG. 3, the power supply device 600 shown in FIG. 9 further includes a second comparator 592. In addition, a non-inverting input end of the second comparator 592 is coupled to the output voltage pin 280 to receive the output voltage $V_O$. An inverting input end of the second comparator 592 receives a second reference voltage $V_{R2}$. The second comparator 592 compares the output voltage $V_O$ and the second reference voltage $V_{R2}$ to generate a second comparison signal S2.

The driving circuit 240 is further coupled to the second comparator 592 to receive the second comparison signal S2. The driving signal 240 generates the driving signal DS in response to the second comparison signal S2, such that the power transistor M3 is turned off or reduces the output current $I_O$ when the voltage value of the output voltage $V_O$ is smaller than a voltage value of the second reference voltage $V_{R2}$. Specifically, when the output current $I_O$ is greater, if the voltage value of the output voltage $V_O$ is too small to make a voltage difference between the drain end and the source end of the power transistor M3 overly large, the power transistor M3 may be damaged. Thus, under-voltage protection is offered by using the second comparator 592 to compare the output voltage $V_O$ and the second reference voltage $V_{R2}$, and making the power transistor M3 be turned off or reduce the output current $I_O$ when the voltage value of the output voltage $V_O$ is smaller than the second reference voltage $V_{R2}$.

Figure 10:
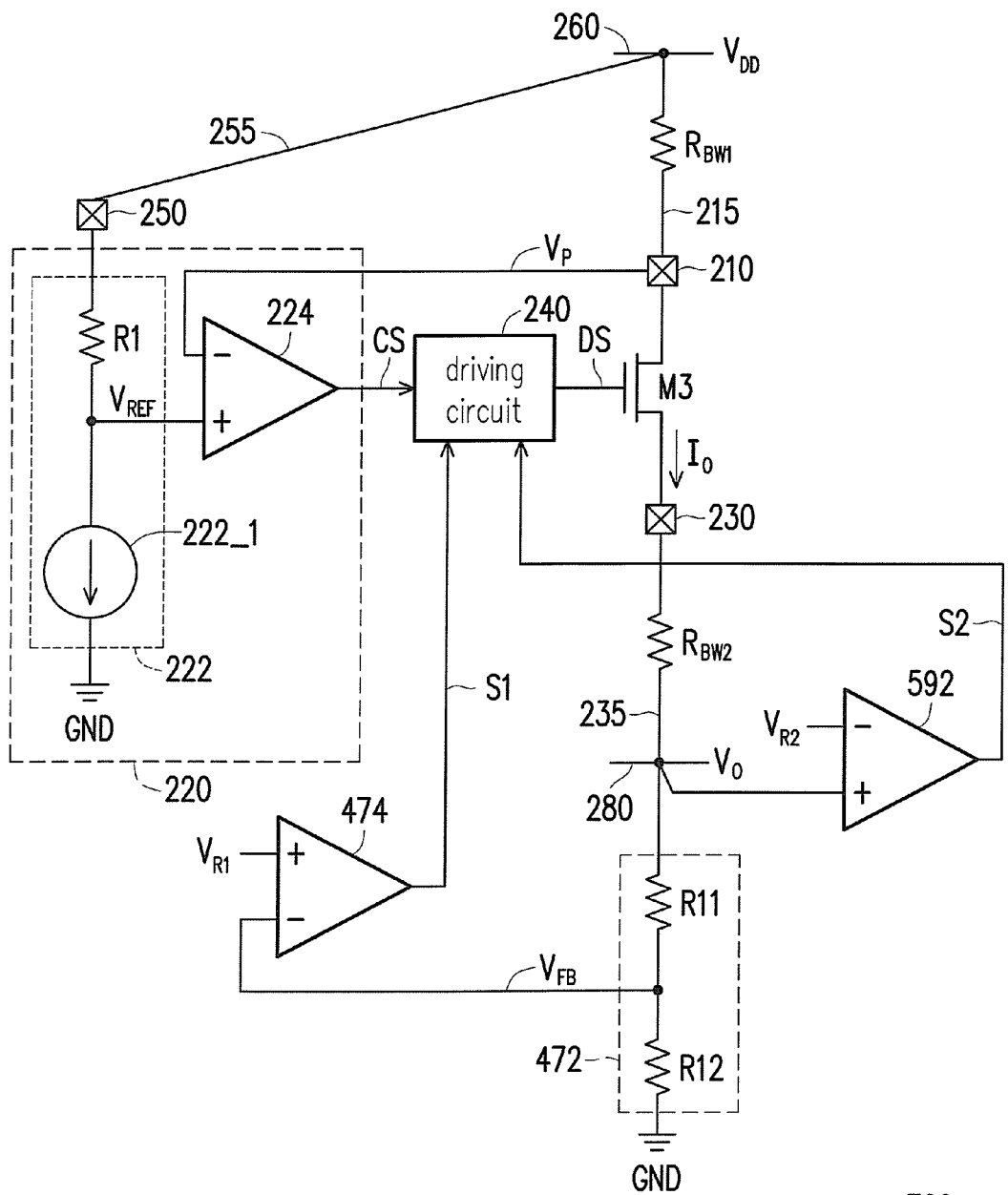
Figure 11:
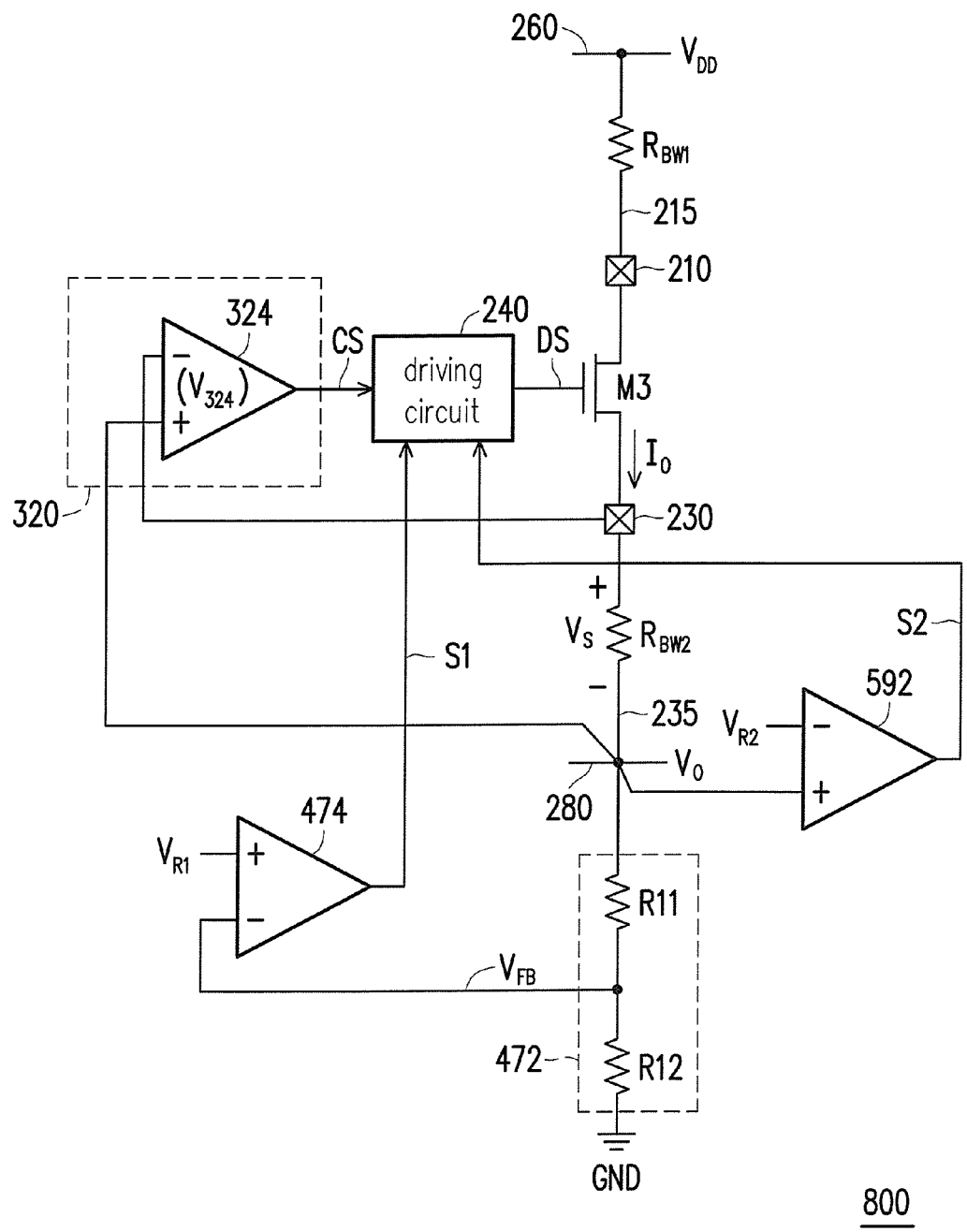

Besides, the second comparator 592 of the power supply device 600 shown in FIG. 9 may also be implemented in the power supply devices 400 and 500 shown in FIGS. 7 and 8 to offer the under-voltage protection function (as shown in FIGS. 10 and 11). Implementation of such function may be inferred based on relevant description about FIG. 9, and is thus not repeated hereinafter.

In view of the foregoing, when the power supply device according to the embodiments of the invention enters the over-current-protection state, the current value of the output current (i.e., the short circuit current value) that is generated by the power supply device is substantially equal to the over-current-protection current value. By setting a higher over-current-protection current value, the output current of the power supply device is effectively increased. In this way, the power supply device is allowed to have a higher starting load, thereby rapidly charging a mobile device. Besides, the detection circuit of the power supply device according to the embodiments of the invention detects the current flowing through the bonding wire, and the current flowing through the bonding wire is the output current generated by the power supply device. Since the parasitic resistance on the bonding wire is able to be accurately controlled and has a smaller error, the detection circuit is thus allowed to accurately detect the output current by measuring the voltage on the bonding wire and control the current value of the output current (i.e., the short circuit current value) at the over-current-protection current value when the power supply device enters the over-current-protection state. In this way, the accuracy of the output current value (i.e., short circuit current value) when the power supply device enters the over-current-protection state is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply device, comprising:
a first bonding wire, wherein the first bonding wire has a parasitic resistance configured as a sampling resistor;
a second bonding wire;
a power transistor, configured to generate an output current, wherein a first source/drain end of the power transistor is coupled to a sampling voltage pad, a second source/drain end of the power transistor is coupled to an output voltage pad, the sampling voltage pad is coupled to a power voltage pin through the first bonding wire, and the output voltage pad is coupled to an output voltage pin through the second bonding wire;
a detection circuit, coupled to two ends of the first bonding wire and configured to detect a voltage drop on the sampling resistor in response to the output current flowing through the first bonding wire or the second bonding wire and generate a control signal accordingly; and
a driving circuit, configured to generate a driving signal in response to the control signal, wherein the driving signal controls the power transistor to generate the output current;
wherein when a current value of the output current is greater than or equal to an over-current-protection current value, the driving circuit starts adjusting a voltage value of the driving signal in response to the control signal, such that the current value of the output current is kept at the over-current-protection current value.

2. The power supply device as claimed in claim 1, wherein
when the current value of the output current is smaller than the over-current-protection current value, the driving circuit fixes the voltage value of the driving signal in response to the control signal, so as to operate the power transistor in a linear region, and
when the current value of the output current is greater than or equal to the over-current protection current value, the driving circuit starts adjusting the voltage value of the driving signal in response to the control signal, so as to operate the power transistor in the linear region or a saturation region, thereby keeping the current value of the output current equal to the over-current-protection current value.

3. The power supply device as claimed in claim 1, wherein the sampling resistor generates a sampling voltage in response to the output current, the detection circuit comprising:
a reference voltage generating circuit, coupled between a power voltage pad and a ground voltage to generate a reference voltage; and
a comparator, configured to compare the reference voltage and the sampling voltage to generate the control signal,
wherein the power voltage pad is coupled to the power voltage pin through a third bonding wire, and
when the current value of the output current is greater than or equal to the over-current-protection current value, a voltage value of the sampling voltage is smaller than or equal to a voltage value of the reference voltage, and the driving circuit starts adjusting the voltage value of the driving signal in response to the control signal, so as to keep the current value of the output current generated by the power transistor at the over-current-protection current value, thereby keeping the voltage value of the sampling voltage at the voltage value of the reference voltage.

4. The power supply device as claimed in claim 3, wherein
when the current value of the output current is smaller than the over-current-protection current value, the voltage value of the sampling voltage is greater than the voltage value of the reference voltage, and the driving circuit fixes the voltage value of the driving signal in response to the control signal, so as to operate the power transistor in a linear region; and when the current value of the output current is greater than or equal to the over-current-protection current value, the voltage value of the sampling voltage is smaller than or equal to the voltage value of the reference voltage, and the driving circuit starts adjusting the voltage value of the driving signal in response to the control signal, so as to operate the power transistor in the linear region or a saturation region, thereby keeping the current value of the output current equal to the over-current-protection current value.

5. The power supply device as claimed in claim 1, wherein the detection circuit is coupled to two ends of the second bonding wire, and the second bonding wire has a parasitic resistance, the detection circuit comprising:

a comparator, provided with a default reference voltage value and configured to detect a voltage difference between two ends of the second bonding wire and compare the voltage difference and the default reference voltage value to generate the control signal, wherein when the current value of the output current is greater than or equal to the over-current-protection current value, the voltage difference is greater than or equal to the default reference voltage value, and the driving circuit starts adjusting the voltage value of the driving signal in response to the control signal, so as to keep the current value of the output current generated by the power transistor at the over-current-protection current value, thereby keeping the voltage difference at the default reference voltage value.

6. The power supply device as claimed in claim 5, wherein when the current value of the output current is smaller than the over-current-protection current value, the voltage difference is smaller than the default reference voltage value, and the driving circuit fixes the voltage value of the driving signal in response to the control signal, so as to operate the power transistor in a linear region; and when the current value of the output current is greater than or equal to the over-current-protection current value, the voltage difference is greater than or equal to the default reference voltage value, and the driving circuit starts adjusting the voltage value of the driving signal in response to the control signal, so as to operate the power transistor in the linear region or a saturation region, thereby keeping the current value of the output current equal to the over-current-protection current value.

7. The power supply device as claimed in claim 1, wherein the driving circuit comprises a charge pump, and the power transistor is an N-type power transistor or a P-type power transistor.

8. The power supply device as claimed in claim 1, wherein the power transistor is further configured to generate an output voltage, and the power supply device further comprises:

a voltage dividing circuit, coupled between the output voltage pin and the ground voltage and configured to divide the output voltage to generate a feedback voltage; and a first comparator, configured to compare the feedback voltage and a first reference voltage to generate a first comparison signal, wherein the driving circuit generates the driving signal in response to the first comparison signal, so as to keep a voltage value of the output voltage generated by the power transistor at a stable voltage value.

9. The power supply device as claimed in claim 1, wherein the power transistor is further configured to generate an output voltage, and the power supply device further comprises:

a comparator, configured to compare the output voltage and a reference voltage to generate a comparison signal, wherein the driving circuit generates the driving signal in response to the comparison signal, so as to make the power transistor be turned off or reduce the output current when the voltage value of the output voltage is smaller than a voltage value of the reference voltage.

10. A power supply device, comprising:

a first bonding wire, wherein the first bonding wire has a parasitic resistance configured as a sampling resistor;

a power transistor, configured to generate an output current, wherein a first source/drain end of the power transistor is coupled to a sampling voltage pad, a second source/drain end of the power transistor is coupled to an output voltage pad, and the sampling voltage pad is coupled to a power voltage pin through the first bonding wire;

a detection circuit, coupled to two ends of the first bonding wire and configured to detect a voltage drop on the sampling resistor in response to the output current flowing through the first bonding wire and generate a control signal accordingly; and a driving circuit, configured to generate a driving signal in response to the control signal, wherein the driving signal controls the power transistor to generate the output current;

wherein when a current value of the output current is greater than or equal to an over-current-protection current value, the driving circuit starts adjusting a voltage value of the driving signal in response to the control signal, such that the current value of the output current is kept at the over-current-protection current value.

* * * * *